(12) United States Patent
Junhua et al.

(10) Patent No.: US 7,152,290 B2
(45) Date of Patent: Dec. 26, 2006

(54) METHODS OF MANUFACTURING A PIEZOELECTRIC ACTUATOR AND A LIQUID JETTING HEAD

(75) Inventors: Chang Junhua, Nagano (JP); Takahiro Katakura, Nagano (JP); Motonori Okumura, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 10 days.

(21) Appl. No.: 10/390,150

(22) Filed: Mar. 18, 2003

(65) Prior Publication Data

US 2004/0108790 A1 Jun. 10, 2004

(30) Foreign Application Priority Data

Mar. 18, 2002 (JP) ............................ P2002-075091
Jul. 8, 2002 (JP) ............................ P2002-199181
Mar. 14, 2003 (JP) ............................ P2003-070548

(51) Int. Cl.
*H04R 17/00* (2006.01)
*B21D 53/76* (2006.01)

(52) U.S. Cl. ...................... 29/25.35; 29/890.1; 29/412; 29/417; 310/311; 310/364; 310/366; 83/39

(58) Field of Classification Search ............... 29/25.35, 29/412–417, 846, 831, 842, 890.1; 310/311, 310/325, 364, 366; 83/29, 39, 44
See application file for complete search history.

(56) References Cited

U.S. PATENT DOCUMENTS 5,640,760 A * 6/1997 Val et al. .................. 29/831 X 5,692,280 A * 12/1997 Taniguchi et al. ......... 29/414 X
6,504,287 B1    1/2003 Yun et al.

FOREIGN PATENT DOCUMENTS

| JP | 02-289352 A | 11/1990 | |
|---|---|---|---|
| JP | 03-128681 A | 5/1991 | |
| JP | 5-183269 | * 7/1993 | .................. 29/846 |
| JP | 09-277531 A | 10/1997 | |
| JP | 09-323410 A | 12/1997 | |
| JP | 10-034924 A | 2/1998 | |

(Continued)

OTHER PUBLICATIONS

Fuda et al., "Ceramic Actuator with Three-Dimensional Electrode Structure", Proceedings of the 8th IEEE International Syposium on Applications of Ferroelectrics, 1992, Aug. 1992, pp. 573-576.*

*Primary Examiner*—A. Dexter Tugbang
(74) *Attorney, Agent, or Firm*—Sughrue Mion, PLLC

(57) ABSTRACT

Methods for manufacturing a piezoelectric actuator and a liquid ejecting head. In particular, a substrate, which is to be a vibration plate actuated by a piezoelectric element is prepared. A plurality of chip regions are defined on the substrate. A first common electrode of the piezoelectric element is formed on the substrate. A first piezoelectric layer of the piezoelectric element is formed on the first common electrode. A drive electrode of the piezoelectric element is formed on the first piezoelectric layer. A second piezoelectric layer of the piezoelectric element is formed on the drive electrode. A second common electrode of the piezoelectric element is formed on the second piezoelectric layer. Then, the substrate is cut so as to divide the chip regions from one another. In the aforementioned aspects of the invention, the first and second common electrodes as well as the drive electrode are formed so as not to extend beyond the outline of each of the chip regions.

3 Claims, 7 Drawing Sheets

FOREIGN PATENT DOCUMENTS

| | | |
|---|---|---|
| JP | 11-005305 A | 1/1999 |
| JP | 2000-077438 A | 3/2000 |
| JP | 2000-141647 A | 5/2000 |
| JP | 2000-332313 A | 11/2000 |
| JP | 2001-077438 A | 3/2001 |
| WO | WO 02/073710 A1 | 9/2002 |

* cited by examiner

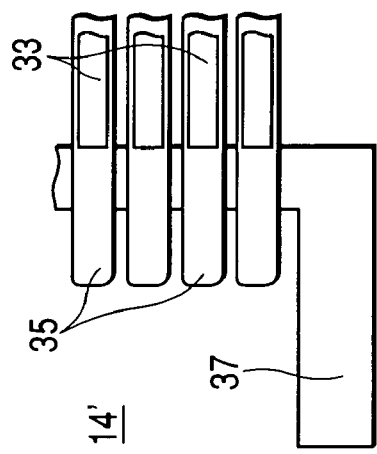
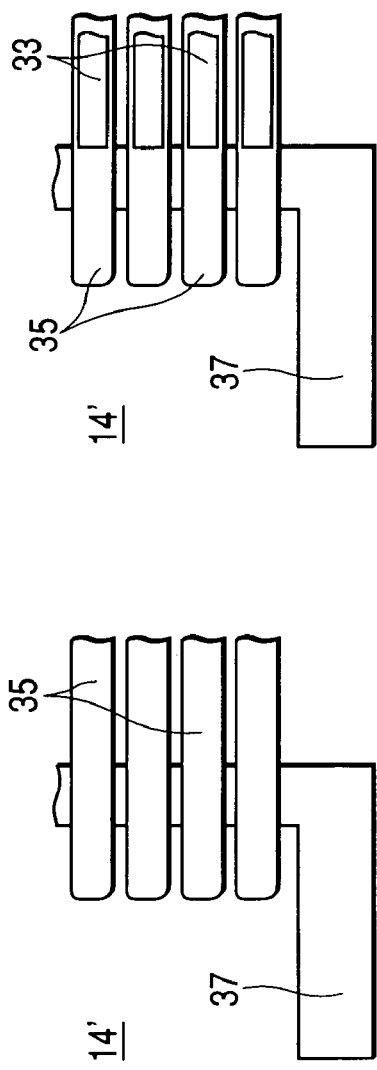
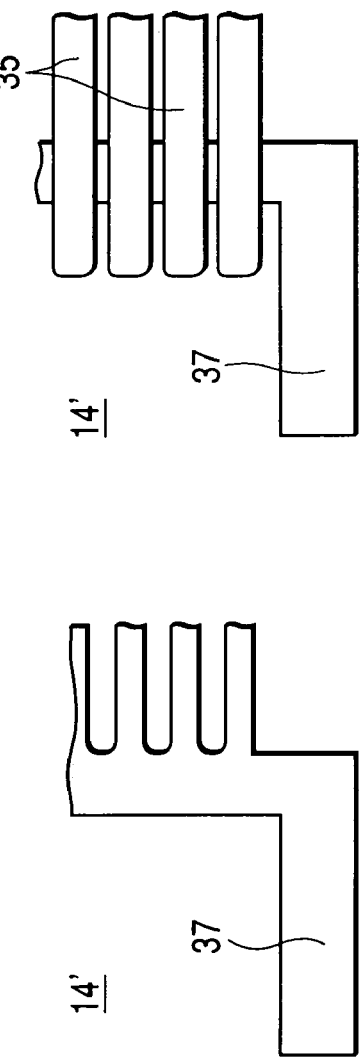
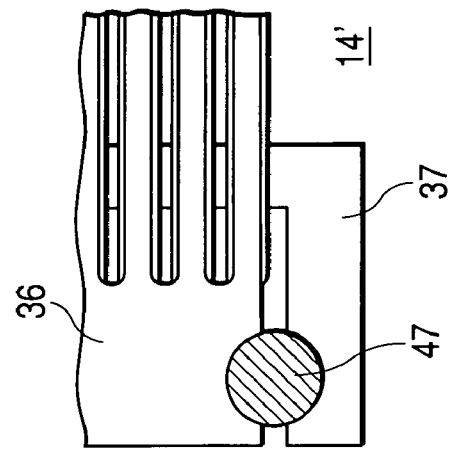
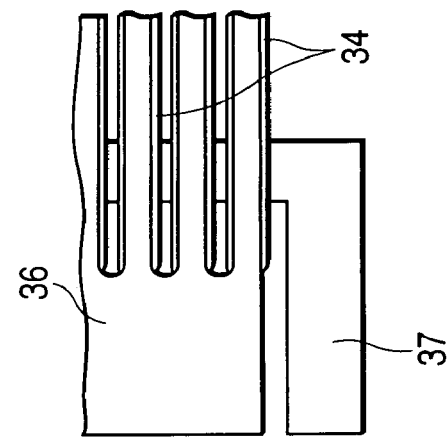
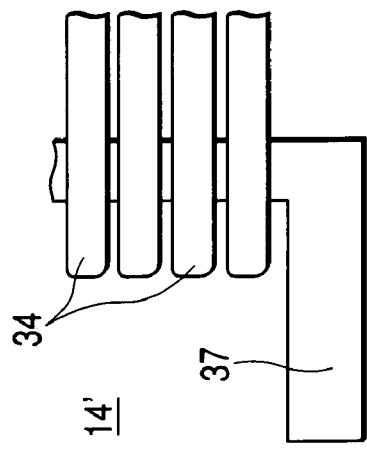

METHODS OF MANUFACTURING A PIEZOELECTRIC ACTUATOR AND A LIQUID JETTING HEAD

BACKGROUND OF THE INVENTION

The invention relates to a method for manufacturing a piezoelectric actuator employing a piezoelectric element which becomes deformed upon receipt of a supplied drive signal, and to a liquid ejecting head equipped with the actuator, as well as to an actuator mother member from which the piezoelectric actuator is originated.

A piezoelectric actuator is a member having a piezoelectric element which becomes deformed upon receipt of supplied electrical energy. The piezoelectric actuator is in widespread use as a drive element for, e.g., a liquid ejecting head, a micropump, and a sounding body (a speaker or the like). Here, the piezoelectric element is formed from piezoelectric ceramics made by compacting and sintering metal oxide powder, such as $BaTiO_3$, $PbZrO_3$, or $PbTiO_3$, which are piezoelectric materials and exhibit a piezoelectric effect, or from a piezoelectric macromolecular film utilizing a high molecular compound.

Here, the liquid ejecting head ejects a droplet from a nozzle orifice by inducing pressure fluctuations in a liquid stored in a pressure chamber. The liquid ejecting head is embodied as, e.g., a recording head to be used in an image recording apparatus such as a printer, a liquid-crystal ejecting head for use in manufacturing a liquid-crystal display, or a coloring material ejecting head to be used for manufacturing a color filter. Here, the micropump is an ultrasmall pump capable of ejecting a very small volume of liquid and used at the time of, e.g., delivery of a trace amount of chemical.

The piezoelectric actuator is mounted on a pressure chamber formation substrate having a void which is to serve as a pressure chamber, and a portion of the pressure chamber is partitioned by the vibration plate. When ejection of a droplet or delivery of liquid is to be performed, a drive pulse is supplied to the piezoelectric element, to thereby deform the piezoelectric element and the vibration plate (i.e., the deformed portion of the pressure chamber) and vary the volume of the pressure chamber.

In the field of the liquid ejecting head and that of the micropump, strong demand exists for high-frequency driving of the piezoelectric element. This demand is intended for implementing high-frequency ejection of a droplet and enhancing liquid delivery capability. In order to implement high-frequency driving of the piezoelectric element, the compliance of the deformed portion must be made smaller than that of a related-art piezoelectric element and the extent to which the piezoelectric element is deformed must be made greater than that to which the related-art piezoelectric element is deformed. The reason for this is that a reduction in the compliance of the deformed portion results in enhancement of responsiveness, thereby enabling driving of the piezoelectric element at a frequency higher than that required conventionally. Another reason is that an increase in the extent to which the piezoelectric element is deformed results in an increase in volumetric change in the pressure chamber, and hence the volume of droplet to be ejected or the volume of droplet to be delivered can be increased.

A piezoelectric element of multilayer structure is proposed for sufficing for a characteristic pertaining to the compliance of the deformed portion and a characteristic pertaining to the extent to which the piezoelectric element becomes deformed, the characteristics being mutually contradictory. For example, a piezoelectric element disclosed in Japanese Patent Publication No. 2-289352A is formed from a piezoelectric layer having a two-layer structure; that is, an upper layer piezoelectric substance and a lower layer piezoelectric substance. Drive electrodes (individual electrodes) are formed at a boundary between the upper layer piezoelectric substance and the lower layer piezoelectric substance. A common electrode is formed on an outer surface of the upper layer piezoelectric substance, and another common electrode is formed on an outer surface of the lower layer piezoelectric substance. Similarly, Japanese Patent Publication No. 10-34924A discloses a piezoelectric element of multilayer structure.

In the case of the piezoelectric element of multilayer structure, the drive electrodes are provided at the boundary between the upper layer piezoelectric substance and the lower layer piezoelectric substance. Hence, an electric field, whose intensity is determined by an interval between the drive electrodes and the respective common electrodes (i.e., the thickness of each piezoelectric substance) and by a potential difference between the drive electrodes and the common electrodes, is imparted to the piezoelectric substances of respective layers. Therefore, in contrast with a piezoelectric element of monolayer structure formed by interposing a single layer piezoelectric substance between the common electrode and the drive electrodes, the piezoelectric element can be deformed at the same drive voltage as that conventionally required, even when the compliance of the deformed portion is reduced by increasing the total thickness of the piezoelectric element to some extent.

However, characteristics capable of responding to recently-growing demand cannot be achieved by mere use of the piezoelectric element of multilayer structure. Therefore, users are forced to use, as an actual product, a piezoelectric element of monolayer structure formed by interposing a single layer piezoelectric substance between a common electrode and drive electrodes. Various factors are conceivable as being responsible for this, including insufficient efficiency of deformation of the piezoelectric element.

For example, on the occasion of mass production of the piezoelectric actuator, manufacturing piezoelectric actuators on an individual basis deteriorates efficiency. Pressure chambers, piezoelectric elements, and feed terminals are provided in number equal to a plurality of units on a ceramic sheet, and the ceramic sheet is cut. When piezoelectric actuators are cut off from the ceramic sheet, electrode material may adhere to a cutting blade. When the electrode material has adhered to the cutting blade, sharpness of the cutting blade will be deteriorated, and there may arise a necessity for cleaning the electrode material adhering to the cutting blade, or a drop in manufacturing efficiency. Further, chips (cuttings) which have arisen during cutting of the ceramic sheet may cause a short-circuit.

The electrode materials adhere to the cutting blade because a feed terminal to be used for supplying an electric signal to the piezoelectric element is set to the maximum size. More specifically, on the occasion of fabricating the piezoelectric element, measurement of electrostatic capacitance is performed as a part of quality control operation, and the feed terminal is used for measuring electrostatic capacitance. In order to bring a probe of a measurement instrument into reliable contact with the feed terminal, the feed terminal must be made as large as possible. A portion of the feed terminal is formed so as to extend beyond a predetermined cutting line (i.e., a contour line of the piezoelectric actuator) provided on the ceramic sheet. Since the feed terminal is for feeding a drive signal to respective piezoelectric elements, the feed terminal remains conductive with a contact terminal of a wiring member; that is, remains electrically connected to the contact terminal. Therefore, when a configuration in which the feed terminal is to be cut is employed, the feed terminal is laid so as to extend up to the contour line of the piezoelectric actuator, thus ensuring electrical connection with the contact terminal. However, as mentioned previously, provision of the contact terminal in this manner is not preferable in terms of manufacturing efficiency.

SUMMARY OF THE INVENTION

The present invention is conceived in view of the foregoing circumstances and aims at providing a method for manufacturing a piezoelectric actuator and a liquid ejecting head equipped with the actuator, which enables enhancement of manufacturing efficiency. Further, the invention aims at providing an actuator mother member having a structure suitable for the manufacturing method.

In order to achieve the above object, according to the invention, there is provided a method of manufacturing a piezoelectric actuator, comprising steps of:
  preparing a substrate, which is to be a vibration plate actuated by a piezoelectric element;
  defining a plurality of chip regions on the substrate;
  forming a first common electrode of the piezoelectric element on the substrate, so as not to extend beyond an outline of each of the chip regions;
  forming a first piezoelectric layer of the piezoelectric element on the first common electrode;
  forming a drive electrode of the piezoelectric element on the first piezoelectric layer, so as not to extend beyond the outline of each of the chip regions;
  forming a second piezoelectric layer of the piezoelectric element on the drive electrode;
  forming a second common electrode of the piezoelectric element on the second piezoelectric layer, so as not to extend beyond the outline of each of the chip regions; and
  cutting the substrate so as to divide the chip regions from one another.

Here, the term "chip region" represents an area corresponding to a piezoelectric actuator serving as a unit; namely, an area which is to become one piezoelectric actuator. For instance, the chip regions correspond to areas which are partitioned (defined) with predetermined cutting lines to be used for cutting piezoelectric actuators from an actuator mother member. Here, the term "mother member" implies a member which is to be cut into piezoelectric actuators.

Preferably, the manufacturing method further comprises a step of forming a terminal electrically connected to the drive electrode, so as not to extend beyond the outline of each of the chip regions, the terminal forming step being performed after the second common electrode is formed and before the substrate is cut.

In the above configurations, the range within which the electrodes are to be formed is set inward of the chip region. Hence, no electrode material adheres to a cutting blade during a process for cutting the ceramic sheet, and hence good sharpness can be maintained over a long time period. As a result, efficiency of mass production of piezoelectric actuators can be enhanced. Moreover, the piezoelectric actuators can also be cut with superior dimensional accuracy.

According to the invention, there is also provided a manufacturing method of a liquid ejecting head, comprising a step of joining the piezoelectric actuator manufactured by the above method with a substrate in which a pressure chamber communicated with a nozzle orifice is formed, such that the piezoelectric element opposes to the pressure chamber.

According to the invention, there is also provided a mother member which is to be a plurality of piezoelectric actuators, comprising:
  a substrate, on which a plurality of chip regions are defined; and
  a piezoelectric element, formed in each of the chip regions, the piezoelectric element including:
    a first common electrode, formed on the substrate so as not to extend beyond an outline of each of the chip regions;
    a first piezoelectric layer, formed on the first common electrode;
    a drive electrode, formed on the first piezoelectric layer so as not to extend beyond the outline of each of the chip regions;
    a second piezoelectric layer, formed on the drive electrode; and
    a second common electrode, formed on the second piezoelectric layer so as not to extend beyond the outline of each of the chip regions.

Preferably, the mother member further comprises a terminal electrically, connected to the drive electrode so as not to extend beyond the outline of each of the chip regions.

BRIEF DESCRIPTION OF THE DRAWINGS

In the accompanying drawings,

FIGS. 8A to 8F are views showing processes for fabricating a piezoelectric element;

DETAILED DESCRIPTION OF THE PREFERRED EMBODIMENTS

Figure 11:
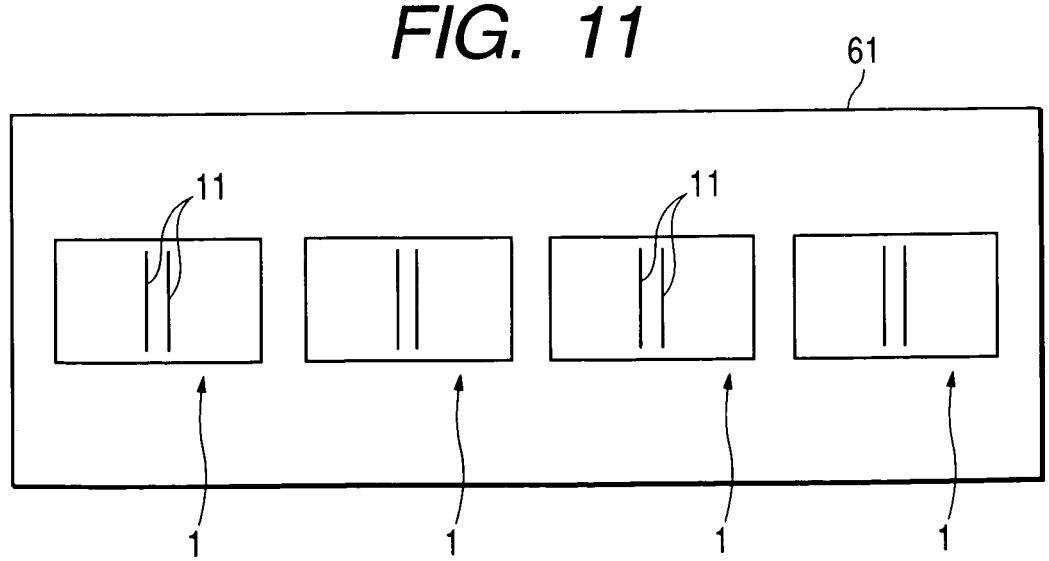
FIG. 11 is a plan view showing a recording head equipped with a plurality of head main bodies.

Embodiments of the invention will be described hereinbelow by reference to the accompanying drawings. Here, a liquid ejecting head will be described by taking, as an example, a recording head to be mounted on an image recording apparatus such as a printer or a plotter. As shown in FIG. 11, for example, the recording head has a plurality of head main bodies 1, and the head main bodies 1 are mounted on a mount base 61.

The basic structure of the head main body 1 will first be described by reference to FIGS. 1 and 2. The head main body 1 is essentially formed from a flow passage unit 2 and an actuator unit 3.

The flow passage unit 2 is fabricated from a supply port formation substrate 6 having formed therein through holes which are to serve as ink supply ports 4, and through holes which are to constitute portions of nozzle communication ports 5; a reservoir formation substrate 8 having formed therein through holes which are to serve as a common ink reservoir 7, and through holes which are to constitute portions of the nozzle communication ports 5; and a nozzle plate 10 having formed therein nozzle orifices 9 oriented in a secondary scanning direction.

The supply port formation substrate 6, the reservoir formation substrate 8, and the nozzle plate 10 are formed by pressing, for example, a stainless steel plate. The flow passage unit 2 is fabricated by placing the nozzle plate 10 on one surface of the reservoir formation substrate 8 (e.g., the lower side in the drawing) and the supply port formation substrate 6 on the other surface of the same (e.g., the upper side in the drawing), and bonding together the supply port formation substrate 6, the reservoir formation substrate 8, and the nozzle plate 10. For instance, the flow passage unit 2 is fabricated by bonding together the members 6, 8, and 10 by use of, e.g., a sheet-shaped adhesive.

Figure 2:
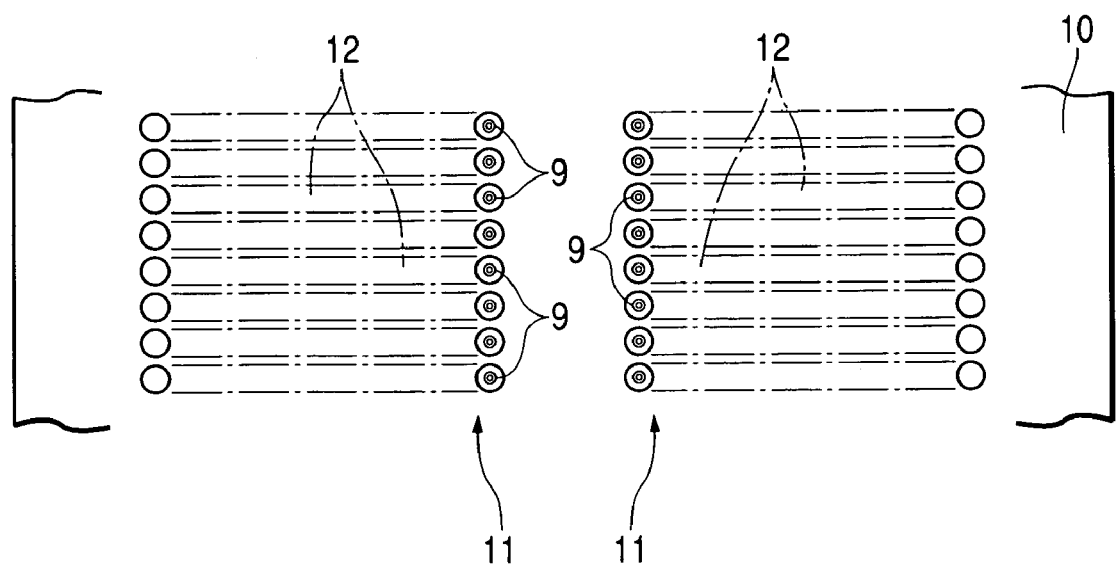
FIG. 2 is a plan view of the head main body when viewed from a nozzle plate.

As shown in FIG. 2, the nozzle orifices 9 are formed in a plurality of rows at predetermined pitches. Rows of nozzles 11 are formed from the plurality of nozzle orifices 9 arranged in rows. For example, a row of nozzles 11 is formed from 92 nozzle orifices 9. Two rows of nozzles 11 are formed side by side.

The actuator unit 3 is a member also called a head chip. The actuator unit 3 comprises a pressure chamber formation substrate 13 having formed therein through holes which are to constitute pressure chambers 12; a vibration plate 14 for defining a part of each pressure chamber 12; a cover member 16 having formed therein through holes which are to constitute portions of supply-side communication ports 15, and through holes which are to constitute portions of the nozzle communication ports 5; and a piezoelectric element 17 formed on the surface of the vibration plate 14 opposite the pressure chamber 12.

With regard to the thicknesses of the members 13, 14, and 16, the pressure chamber formation substrate 13 and the cover member 16 preferably assume a thickness of 50 μm or more, more preferably 100 μm or more. The vibration plate 14 preferably assumes a thickness of 50 μm or less, more preferably 3 to 12 μm or thereabouts. In the actuator unit 3, the vibration plate 14 and the piezoelectric element 17 constitute a kind of piezoelectric actuator of the invention.

The actuator unit 3 is made by placing the cover member 16 onto one surface of the pressure chamber formation substrate 13, and the vibration plate 14 onto the other surface of the same, and forming the piezoelectric elements 17 on the surface of the vibration plate 14 opposite the pressure chamber 12. Of these members, the pressure chamber formation substrate 13, the vibration plate 14, and the cover member 16 are made from ceramics such as alumina or zirconia and are integrated together by sintering (to be described later).

The pressure chamber 12 is a hollow section which is elongated in the direction orthogonal to the row of nozzles 11, and a plurality of pressure chambers 12 are formed so as to correspond to the nozzle orifices 9. Specifically, as shown in FIG. 2, the pressure chambers 12 are arranged in rows in line with the row of nozzles. One end of each pressure chamber 12 is in communication with the corresponding nozzle orifice 9 by way of the nozzle communication port 5. The other end on the side of the pressure chamber 12 opposite the nozzle communication port 5 is in communication with the common ink reservoir 7 by way of the supply-side communication port 15 and the ink supply port 4. A part of the pressure chamber 12 is partitioned by the vibration plate 14.

Figure 3:
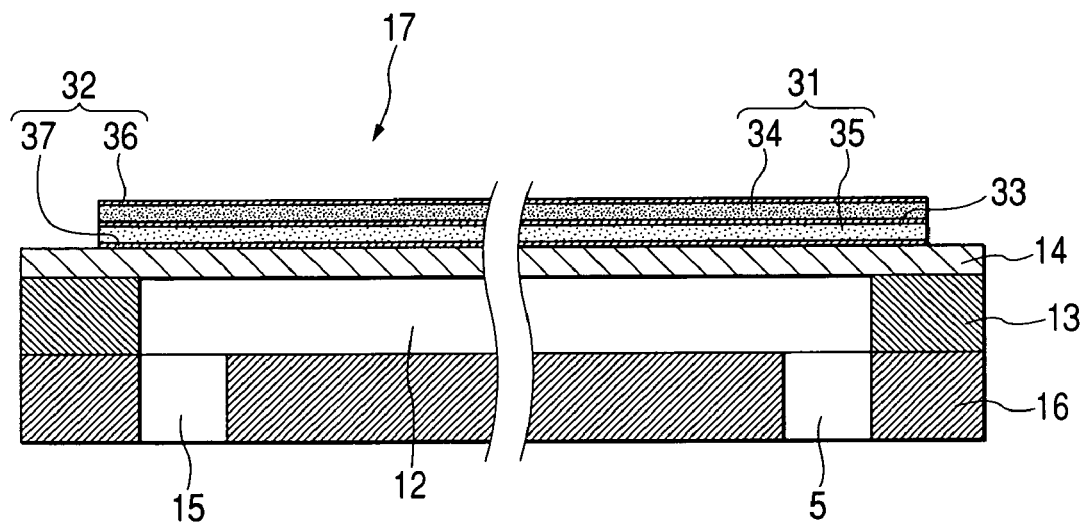
FIG. 3 is a cross-sectional view of an actuator unit taken along a longitudinal direction of a pressure chamber.
Figure 4:
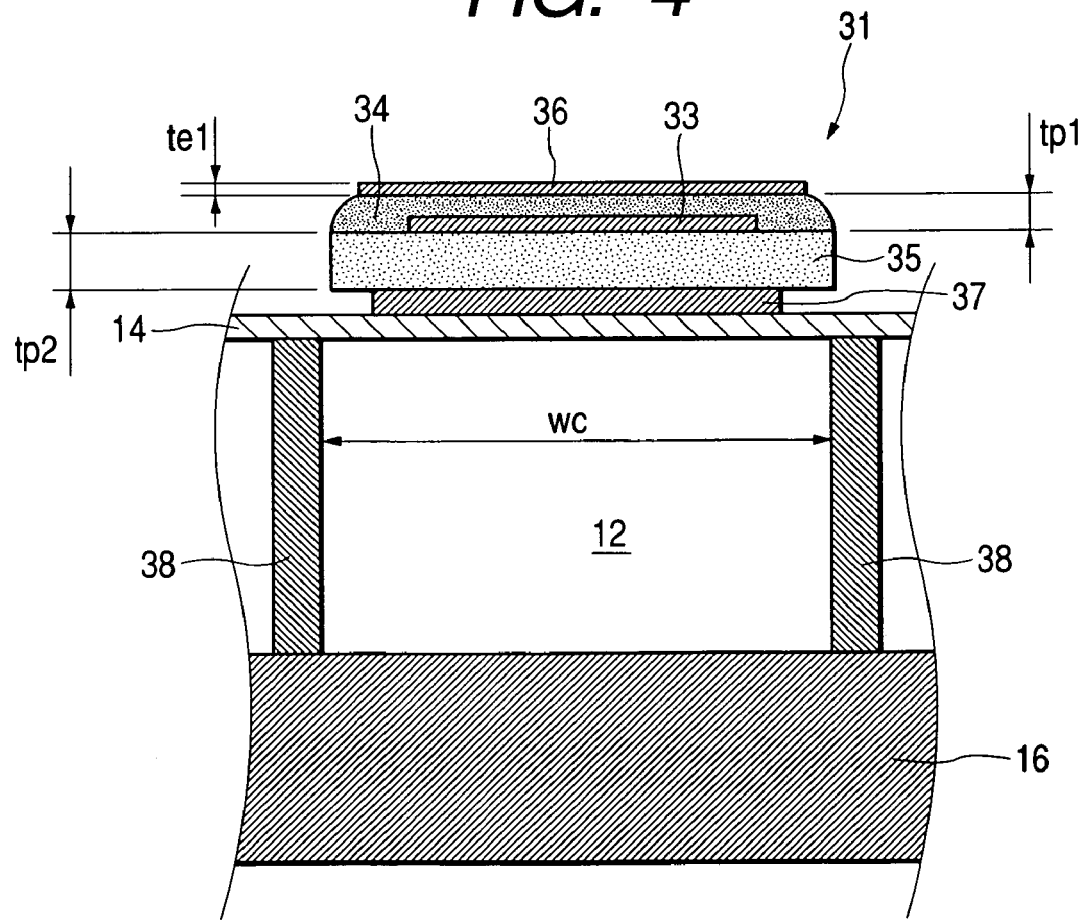
FIG. 4 is a cross-sectional view of an actuator unit taken along a transverse direction of the pressure chamber.

Here, the piezoelectric element 17 is a piezoelectric element of so-called flexural vibration mode and is provided, for each pressure chamber 12, on the surface of the vibration plate 14. As shown in FIGS. 3 and 4, the piezoelectric element 17 is substantially identical in width with the pressure chamber 12 and somewhat greater in length than the same. Both longitudinal ends of the piezoelectric element 17 project beyond the pressure chamber 12 to the outside; namely, the piezoelectric element 17 is formed so as to cover the pressure chamber 12 in the longitudinal direction thereof.

The piezoelectric element 17 has a multilayer structure formed from a piezoelectric layer 31, a common electrode 32, a drive electrode 33, and other elements. The piezoelectric layer 31 is sandwiched between the drive electrode 33 and the common electrode 32. The structure of the piezoelectric element 17 will be described later in detail.

A drive signal supply source (not shown) is electrically continuous with or connected to the drive electrode 33. The common electrode 32 is controlled to, e.g., a ground potential. When a drive signal is supplied to the drive electrode 33, an electric field whose intensity is related to a potential difference between the drive electrode 33 and the common electrode 32 is induced. Since the electric field is imparted to the piezoelectric layer 31, the piezoelectric layer 31 becomes deformed in response to supply of the drive signal. In this case, as the electric potential of the drive electrode 33 increases, the piezoelectric layer 31 contracts in the direction orthogonal to the electric field, thereby deforming the vibration plate 14 such that the volume of the pressure chamber 12 is reduced. Conversely, as the electric potential of the drive electrode 33 is lowered, the piezoelectric layer 31 expands in the direction orthogonal to the electric field, thereby deforming the vibration plate 14 such that the volume of the pressure chamber 12 is increased.

The actuator unit 3 and the flow passage unit 2 are bonded together in a unit bonding process whose processing is to be performed subsequent to a cutting process which will be described later. For instance, a sheet-shaped adhesive is interposed between the supply port formation substrate 6 and the cover member 16. In this state, pressure is applied to the actuator unit 3 toward the flow passage unit 2, whereupon the actuator unit 3 and the flow passage unit 2 are bonded together.

Figure 1:
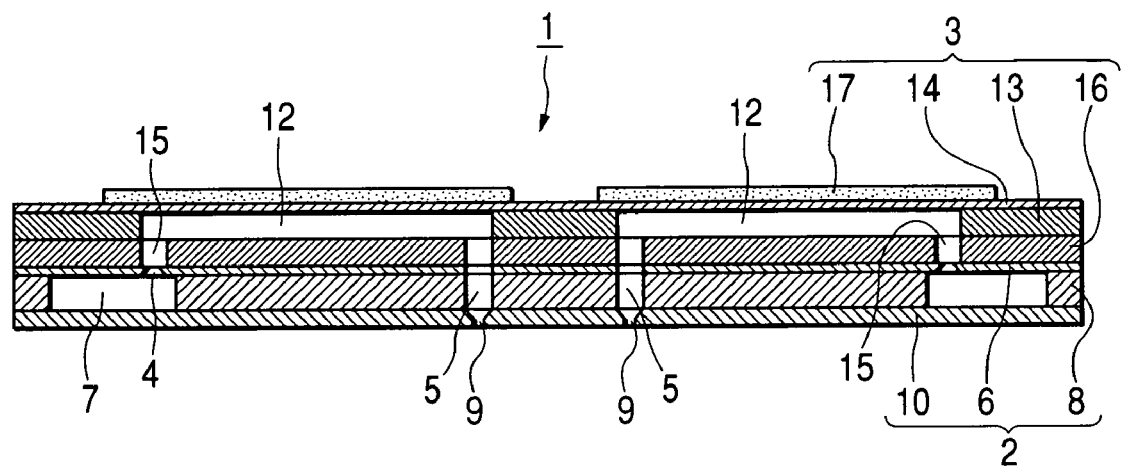
FIG. 1 is a cross-sectional view showing the basic structure of a head main body.

As shown in FIG. 1, in the head main body 1, a continuous ink flow passage is formed for each nozzle orifice 9 so as to extend from the common ink reservoir 7 to the nozzle orifice 9 by way of the ink supply port 4, the supply-side communication port 15, the pressure chamber 12, and the nozzle communication port 5. When the actuator unit is in use, the interior of the ink flow passage is filled with ink. When an ink droplet is ejected from the nozzle orifice 9, ink is supplied from the common ink reservoir 7 to the ink flow passage, thereby deforming the piezoelectric element 17. As a result, a corresponding pressure chamber 12 is subjected to contraction or expansion, thereby causing pressure fluctuations in the ink stored in the pressure chamber 12.

By controlling the ink pressure, the nozzle orifice 9 can be caused to eject an ink droplet. For instance, if the pressure chamber 12 having a stationary volume is subjected to rapid expansion once having been contracted, the pressure chamber 12 is filled with ink in association with expansion of the pressure chamber 12. By subsequent rapid contraction, the ink stored in the pressure chamber 12 is pressurized, whereupon an ink droplet is ejected.

Here, high-speed recording operation involves a necessity for ejecting a larger number of ink droplets within a short time period. In order to satisfy this requirement, the compliance of a deformed portion of the pressure chamber 12 (i.e., the portion of the pressure chamber partitioned by the vibration plate 14 and the piezoelectric element 17) and the amount of deformation of the piezoelectric element 17 must be taken into consideration. More specifically, as the compliance of the deformed portion becomes greater, responsiveness of the pressure chamber to deformation is deteriorated, whereby driving of the recording head at a high frequency becomes difficult. In contrast, as the compliance of the deformed portion becomes smaller, the amount of deformation of the pressure chamber 12 becomes smaller, whereby the volume of one ink droplet is also decreased.

From this viewpoint, in the case of a recording head employing a piezoelectric element of flexural vibration mode which has already become commercially practical, there is employed a piezoelectric element of monolayer structure formed by interposing a single layer of piezoelectric substance between a common electrode and a drive electrode. The piezoelectric element has a maximum response frequency of about 25 kHz and a maximum ink droplet volume of about 13 pL (picoliters).

In the embodiment, the compliance of the vibration plate 14 is reduced by use of the piezoelectric element 17 of multilayer structure. Further, the piezoelectric element 17 is improved. Thus, the recording head of the invention can eject the required volume of ink droplet at a frequency higher than that at which an ink droplet has hitherto been ejected. The following description explains this point.

First, the structure of the piezoelectric element 17 is described in detail. As shown in FIGS. 3 and 4, the piezoelectric layer 31 is formed from an upper layer piezoelectric substance (i.e., an outer piezoelectric substance) 34 and a lower layer piezoelectric substance (i.e., an inner piezoelectric substance) 35. The common electrode 32 is formed from an upper common electrode (i.e., an outer common electrode) 36 and a lower common electrode (i.e., an inner common electrode) 37. The common electrode 32 and a drive electrode (individual electrodes) 33 constitute an electrode layer.

Here, the terms "upper (or outer)" and "lower (or inner)" denote a positional relationship with reference to the vibration plate 14. In other words, the term "upper (outer)" denotes the surface of the piezoelectric element distant from the vibration plate 14, and the term "lower (inner)" denotes the surface of the same close to the vibration plate 14.

The drive electrode 33 is formed at a boundary between the upper layer piezoelectric substance 34 and the lower layer piezoelectric substance 35 such that the entire width of the drive electrode 33 is covered with the upper layer piezoelectric substance 34. The lower common electrode 37 is formed in a lower portion of the lower layer piezoelectric substance 35; that is, at a position between the lower layer piezoelectric substance 35 and the vibration plate 14, such that the entire width of the lower common electrode 37 is covered with the lower layer piezoelectric substance 35. Further, the upper common electrode 36 is formed on the surface of the upper layer piezoelectric substance 34 opposite the lower layer piezoelectric substance 35. Accordingly, the piezoelectric element 17 has a multilayer structure comprising, in order from the vibration plate 14, the lower common electrode 37, the lower layer piezoelectric substance 35, the drive electrode 33, the upper layer piezoelectric substance 34, and the upper common electrode 36. The thickness of the piezoelectric layer 31 is equal to a total thickness of the upper layer piezoelectric substance 34 and the lower layer piezoelectric substance 35; that is, about 17 µm. Further, the total thickness of the piezoelectric element 17, including the common electrode 32, is about 20 µm. The total thickness of the conventional piezoelectric element 17 of monolayer structure is about 15 µm. As the thickness of the piezoelectric element 17 is increased, the compliance of the vibration plate 14 becomes smaller correspondingly.

The upper common electrode 36 and the lower common electrode 37 are controlled to a given potential regardless of the drive signal and serve as common electrodes as mentioned above. In the embodiment, the upper common electrode 36 and the lower common electrode 37 are electrically connected together and controlled to the earth potential. The drive electrode 33 is electrically connected to the drive signal supply source and changes a potential in accordance with a supplied drive signal. Accordingly, supply of the drive signal induces an electric field between the drive electrode 33 and the upper common electrode 36 and between the drive electrode 33 and the lower common electrode 37, wherein the electric fields are opposite in direction to each other.

Various conductors; e.g., a single metal substance, a metal alloy, or a mixture consisting of electrically insulating ceramics and metal, are selected as materials which constitute the electrodes 33, 36, and 37. The materials are required not to cause any deterioration at a sintering temperature. In the embodiment, gold is used for the upper common electrode 36, and platinum is used for the lower common electrode 37 and the drive electrode 33.

The upper layer piezoelectric substance 34 and the lower layer piezoelectric substance 35 are formed from piezoelectric material containing, e.g., lead zirconate titanate (PZT) as the main ingredient. The direction of polarization of the upper layer piezoelectric substance 34 is opposite that of the lower layer piezoelectric substance 35. Therefore, when the drive signal is applied to the upper layer piezoelectric substance 34 and the lower layer piezoelectric substance 35, the substances expand and contract in the same direction and can become deformed without any problem. The upper layer piezoelectric substance 34 and the lower layer piezoelectric substance 35 deform the vibration plate 14 such that the volume of the pressure chamber 12 is reduced with an increase in the potential of the drive electrode 33 and such that the volume of the pressure chamber 12 is increased with a decrease in the potential of the drive electrode 33.

In the embodiment, in order to efficiently deform the piezoelectric element 17 of multilayer structure, the thickness tp 1 of the upper layer piezoelectric substance 34 is set to three-fourths or less the thickness tp 2 of the lower layer piezoelectric substance 35, thereby rendering the degree of deformation of the upper layer piezoelectric substance 34 stemming from supply of the drive signal greater than that of the lower piezoelectric substance 35. In short, when the same drive signal is supplied, the upper layer piezoelectric substance 34 is deformed to a greater extend than is the lower layer piezoelectric substance 35. In this way, when the upper layer piezoelectric substance 34 has become deflected to a greater extent than the lower layer piezoelectric substance 35, the upper layer piezoelectric substance 34 is spaced farther from the vibration plate 14 than is the lower layer piezoelectric substance 35, and hence, deformation of the upper layer piezoelectric 34 acts on the vibration plate 14 while the amount of deformation is amplified. Thus, the amount of deformation of the vibration plate 14 can be increased.

The vibration plate 14 can be deformed to a great extent, and hence the volume of the pressure chamber 12, which would be achieved at the time of contraction of the piezoelectric element, can be made smaller. Accordingly, a volumetric difference between the expanded pressure chamber 12 and the contracted pressure chamber 12 can be made greater than when the piezoelectric element 17 of multilayer structure is simply used, thereby increasing the quantity of ink droplet to be ejected.

An electrode material which is thinner and more flexible than those of the other electrodes (i.e., the drive electrode 33 and the lower common electrode 37) is used for the upper common electrode 36, in view that the upper common electrode 36 deforms to a greater extent than the other electrodes. Specifically, the upper common electrode 36 is formed on the surface of the upper layer piezoelectric substance 34 and becomes deformed to a greater extent than the other electrodes. For this reason, a material which is softer than those used for the other electrodes is used for the upper common electrode 36 and/or in a small thickness. As a result, there can be prevented occurrence of a rupture, which would otherwise be caused by repeated deformation. In order to prevent an excessive increase in electrical resistance, which would otherwise arise when the thickness of the upper common electrode is reduced, an electrode material having superior conductivity like gold is preferably used.

More specifically, as mentioned above, in relation to the material of an electrode, the upper common electrode 36 is formed from gold, and the drive electrode 33 and the lower common electrode 37 are formed from platinum. In relation to the thicknesses of the electrodes, the lower common electrode 37 and the drive electrode 33 assume a thickness of 2 to 3 μm, and the upper common electrode 36 assumes a thickness (te1) which is about one-tenth the value of 2 to 3 μm (e.g., 0.3 μm). By such a configuration, the upper common electrode 36 can be deformed so as to follow the piezoelectric element 17, thereby preventing occurrence of a problem; that is, impairment of the amount of deformation of the piezoelectric element 17. Further, even when being deformed repeatedly, the piezoelectric element 17 is less susceptible to a break in wiring. Moreover, an electric current can be caused to efficiently flow through the upper common electrode 36.

Figure 5:
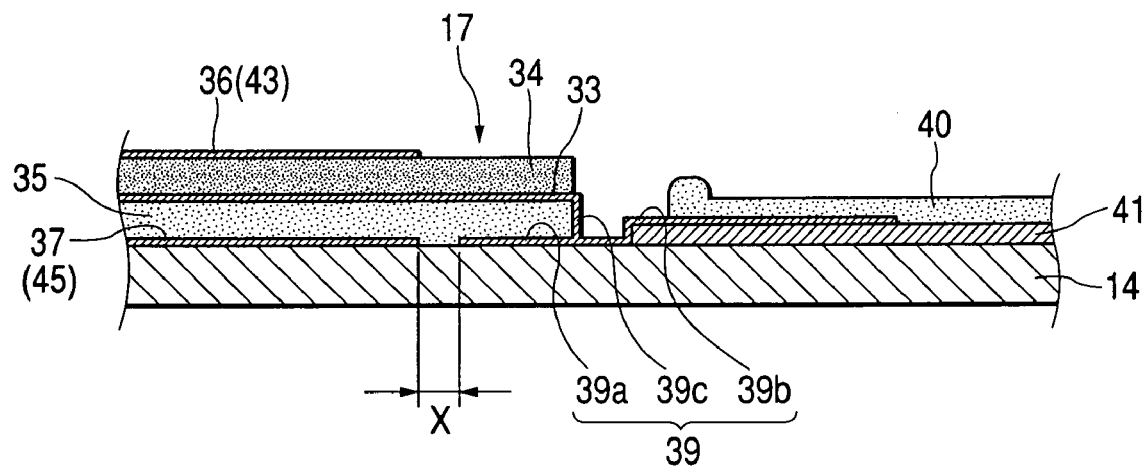
FIG. 5 is a cross-sectional view showing an end structure of a drive electrode.

For example, as shown in FIG. 5, the drive electrode 33 becomes exposed outside at one longitudinal end of the piezoelectric element 17 and is electrically connected to a conduction electrode 39 at the end face of the piezoelectric element 17. The drive electrode 33 is brought into electrical conduction with the feed terminal 40 by way of the conduction electrode 39. The feed terminal 40 is a contact terminal to be used for supplying a drive signal. A plurality of feed terminals 40 are formed for each drive electrode 33. In the embodiment, the feed terminals 40 are formed by sintering a silver paste.

Contact terminals (not shown) to be used for feeding a drive signal provided in a flexible flat cable (FFC) are electrically connected to the respective feed terminals 40. Accordingly, the drive signal is supplied to a corresponding drive electrode 33 by way of the feed terminal 40 and the conduction electrode 39.

The conduction electrode 39 is continuously formed on the end face of the piezoelectric element 17, the surface of the vibration plate 14, and the surface of a terminal substrate 41 on which the feed terminal 40 is to be provided. As mentioned above, the lower common electrode 37 is also formed on the surface of the vibration plate 14. However, a disconnection region X where no electrode is to be formed is set between the conduction electrode 39 and the lower common electrode 37. Hence, the conduction electrode 39 and the lower common electrode 37 are electrically isolated from each other.

As mentioned above, the piezoelectric element 17 is provided for each nozzle orifice 9. Hence, the number of piezoelectric elements 17 to be provided for one row of nozzles 11 is 92. Although the upper common electrode 36 and the lower common electrode 37 are brought into conduction; that is, they are electrically connected together, a working efficiency will be deteriorated if the common electrodes 36, 37 are electrically connected together for each piezoelectric element 17, thereby resulting in a failure to improve productivity.

In view of the circumstances, in the embodiment, the upper common electrode 36 and the lower common electrode 37 are formed from a pectinated electrode consisting of a trunk electrode and a plurality of prong electrodes. After having been subjected to predetermined inspection and polarization processing, the trunk electrodes are electrically connected together. The following description will explain this point.

Figure 7A:
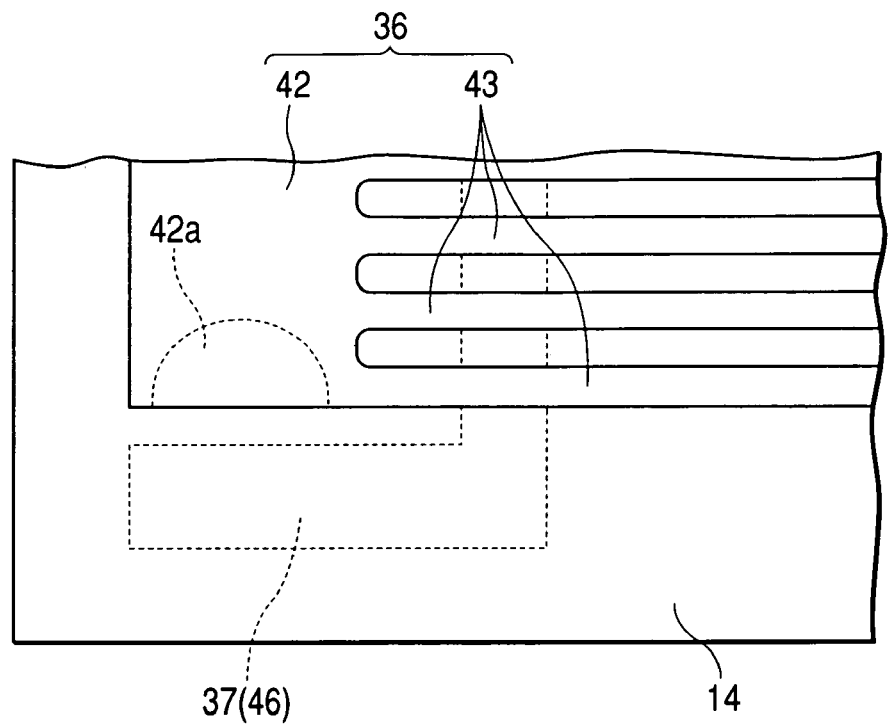
FIG. 7A is a plan view of an upper common electrode.

As shown in FIG. 7A, the upper common electrode 36 is formed from a swath trunk electrode (proximal electrode) 42 which is elongated in the direction of a nozzle row; and a plurality of prong electrodes 43 which are continuously formed on one side of the trunk electrode 42 so as to cover the surface of the piezoelectric element 17 (i.e., the upper layer piezoelectric substance 34). The upper common electrode 36 is formed in a pectinated pattern.

Figure 6:
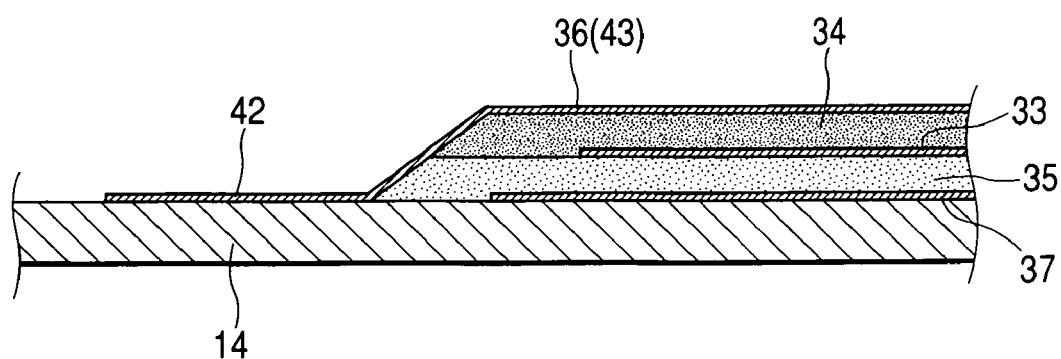
FIG. 6 is a cross-sectional view showing the end structure of a common electrode.

The trunk electrode 42 is formed on the surface of the vibration plate 14, and the width of the trunk electrode 42 is set so as to become sufficiently greater than the width of the prong electrode 43 so that an electric current can be caused to flow to the prong electrodes without a problem even when the drive signals are simultaneously supplied to all the piezoelectric elements 17. As indicated by dashed lines in FIG. 7A, a conduction area 42a is provided at the longitudinal end of the trunk electrode 42. The conduction area 42a is used for bringing the upper common electrode 36 and the lower common electrode 37 into conduction with each other (to be described later). As shown in FIG. 6, the respective prong electrodes 43 are formed on the surface of the upper layer piezoelectric substance 34 so as to run over a slope surface formed at one end of the piezoelectric layer 31 (i.e., an end section of the piezoelectric layer 31 close to the trunk electrode 42).

As shown in FIG. 5, the extremities of the respective prong electrodes 43 (i.e., extremities of the same opposite the trunk electrode 42) are located at positions inward of the end face of the upper layer piezoelectric substance 34 (i.e., the end face close to the feed terminals 40). This is intended for preventing occurrence of a failure due to a short which would arise between the prong electrodes 43 and the drive electrode 33. More specifically, there can be prevented occurrence of a failure, which would otherwise be caused when a short-circuit arises between the prong electrodes 43 and the drive electrode 33 by atmospheric discharge as a result of the extremities of the prong electrodes 43 having been spaced from the drive electrode 33.

Figure 7B:
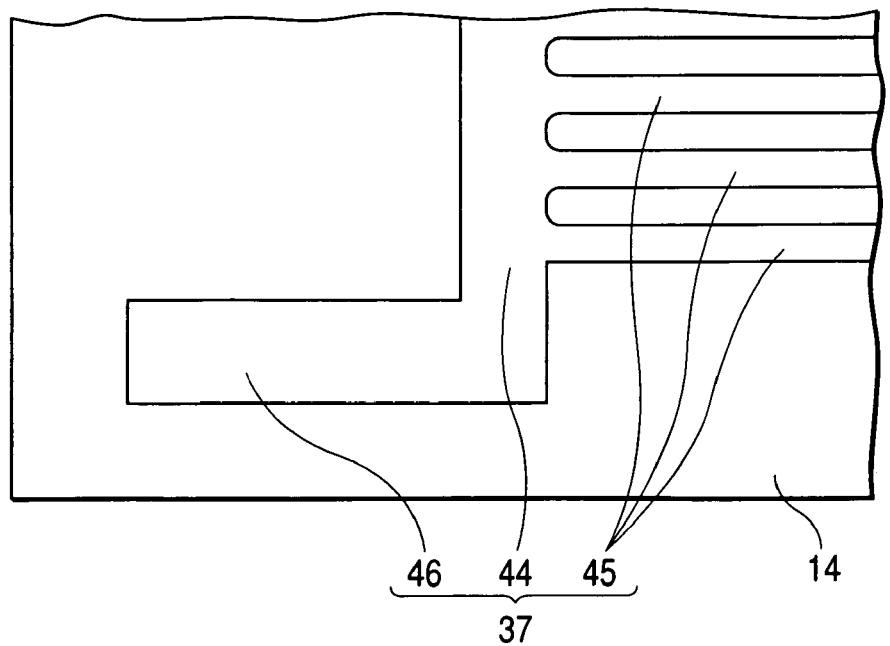
FIG. 7B is a plan view of a lower common electrode.

The entirety of the lower common electrode 37 is formed on the surface of the vibration plate 14. As shown in FIG. 7B, the lower common electrode 37 is formed into a pectinated pattern from a swath trunk electrode (proximal electrode) 44 which is elongated in the direction of the nozzle row; a plurality of prong electrodes 45 on one side of the trunk electrode 44 for respective piezoelectric elements 17 (i.e., the lower layer piezoelectric substance 35); and a conduction strip section 46 extending from one end of the trunk electrode 44 in the direction opposite the prong electrodes 45.

The width of the trunk electrode 44 is set so as to become sufficiently greater than the width of the prong electrode 45 so that an electric current can be caused to flow to the prong electrodes without a problem even when the drive signals are simultaneously supplied to all the piezoelectric elements 17. The prong electrodes 45 are located between the piezoelectric layer 31 (i.e., the lower layer piezoelectric substance 35) and the vibration plate 14, and the positions of extremities of the prong electrodes 45 (i.e., ends of the prong electrodes opposite the trunk electrode 44) in the longitudinal direction of the piezoelectric element are aligned with extremities of the upper common electrodes 36, as shown in FIG. 5.

The conduction strip section 46 is used for bringing the lower common electrode 37 into conduction with the upper common electrode 36. For this reason, the conduction strip section 46 is formed at a position close to the conduction area 42a. As shown in FIG. 8F, a conduction member 47, such as solder, is provided so as to extend across the conduction area 42a and the conduction strip section 46. Consequently, electrical connection of the common electrodes 36, 37 can be achieved by merely forming the conduction member 47 so as to extend across the conduction area 42a and the conduction strip section 46, thereby enabling simplification of work. This structure is suitable for automating operations for assembling piezoelectric elements.

In relation to the method for manufacturing a recording head, a method for manufacturing the actuator unit 3 will be chiefly described. The actuator unit 3 is manufactured through, in the sequence given, a mother member manufacturing process for forming an actuator mother member, and a process for cutting the actuator mother member into the chip regions 19 (see FIG. 10). In the embodiment, the actuator unit 3 is not manufactured individually. After the mother member is prepared, a plurality of actuator units 3 are cut from the mother member, in order to improve manufacturing efficiency.

Here, the term "actuator mother member" means a member which is to be cut into a piezoelectric actuator (e.g., the vibration plate 14 and the piezoelectric element 17). The actuator mother member comprises a sheet-shaped ceramic body which is to become the vibration plate 14 (hereinafter also called a "vibration plate base"); the piezoelectric elements 17 to be provided on the surface of the vibration plate base; and the feed terminals 40. In the base member manufacturing process, the ceramic sheet 18 including the actuator mother member is prepared. More specifically, the mother member preparation process comprises a sheet preparation process for preparing a ceramic sheet base member; an element formation process for forming the plurality of piezoelectric elements 17 on the surface of the sheet base member for each chip region 19; and a feed terminal formation process for preparing the ceramic sheet 18 by forming the plurality of feed terminals 40 on each piezoelectric element 17. Processing pertaining to these processes is performed in sequence.

In the sheet preparation process, first, a ceramic slurry is prepared from ceramic material, a binder, a liquid medium, or the like. Next, a green sheet (i.e., a sheet material which has not yet been sintered) is formed from the slurry through use of a commonly employed apparatus such as a doctor blade apparatus or a reverse roll coater. Subsequently, the green sheet is subjected to processing, such as cutting or punching, thereby forming required through holes. Thus, sheet-shaped precursors for the pressure chamber formation substrate 13, the vibration plate 14, and the cover member 16 are formed. The sheet-shaped precursors are laminated and sintered, thereby integrating the sheet-shaped precursors and producing a single sheet-shaped member. Specifically, the sheet base member comprises a sheet-shaped member which is to become a pressure chamber formation plate 13 (a formation plate base); the vibration plate member; and the sheet-shaped member which is to become the cover member 16 (a cover base). In this case, since the sheet-shaped precursors are formed integrally, special bonding operation is not necessary. Moreover, a high sealing characteristic can also be achieved at cemented surfaces of the respective sheet-shaped precursors.

Figure 10:
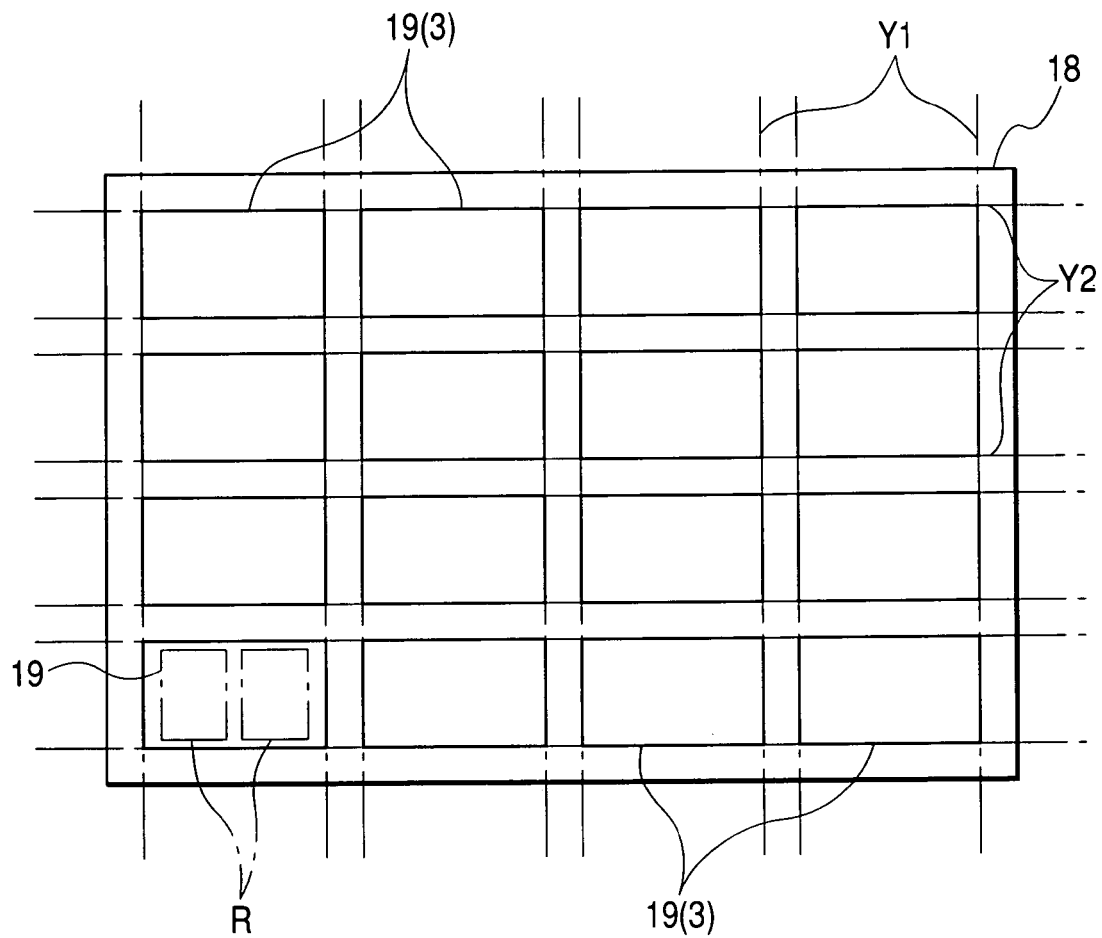
FIG. 10 is a view showing a positional relationship between a ceramic sheet and chip regions.

As shown in FIG. 10, a plurality of rectangular chip regions 19 are set in a matrix pattern on one sheet mother member. Here, the "chip region" means an area which is to become one actuator unit 3; that is, an area which is to become a piezoelectric actuator. For instance, areas partitioned (surrounded) by predetermined cutting lines Y1, Y2 to be used for cutting the actuator units 3 from the actuator mother member correspond to the chip regions. Accordingly, the pressure chambers 12, the nozzle communication ports 5, and the like are provided within each of the partitioned chip region 19.

In the embodiment, after production of the sheet base member, the terminal substrate 41 is first formed. The terminal substrate 41 is formed on the surface of the vibration plate base member opposite the pressure chamber 12. For instance, the terminal substrate 41 is formed from ceramics. Specifically, after a ceramic paste is applied over the sheet base member in a predetermined pattern, the sheet base member is sintered, thereby forming the terminal substrate 41. After the terminal substrate 41 is formed, processing proceeds to the element formation process.

In the element formation process, the respective piezoelectric elements 17 are formed on the surface of the vibration plate base member. By reference to FIGS. 8A to 8E, the element formation process will be described. As shown in FIG. 8A, a lower common electrode 37 is first formed on the surface of a vibration plate base member 14' in the element formation process. In the embodiment, the lower common electrode 37 is formed through printing. Accordingly, a mask is placed at a predetermined location on the vibration plate base member 14'. A platinum paste is applied over the vibration plate base member 14' via the mask. So long as the platinum paste is applied over the surface of the vibration plate base member 14', the platinum paste is sintered. More specifically, the vibration plate base member 14' to which the platinum paste is applied is sintered in a baking furnace at a predetermined temperature over a predetermined time period. By sintering operation, the lower common electrode 37 is formed on the surface of the vibration plate base member 14'.

In the process, portions of the conduction electrode 39 are also formed simultaneously. As shown in FIG. 5, a vibration plate surface portion of the conduction electrode 39 (i.e., a vibration plate section) 39a and a terminal substrate surface portion (i.e., a terminal substrate section) 39b are formed. Accordingly, a mask used in the first process is provided with a pattern to be used for forming the lower common electrode 37 and a pattern to be used for forming the vibration plate section 39a and the terminal substrate section 39b in the conduction electrode 39.

As shown in FIG. 8B, when the lower common electrode 37 is formed, the lower layer piezoelectric substance 35 is formed. Namely, after a mask is placed at a predetermined location on the vibration plate base member 14', a piezoelectric material (e.g., lead zirconate titanate) paste is applied over the lower common electrode 37. The thus-applied piezoelectric material paste is sintered.

Subsequently, as shown in FIGS. 8C to 8E, the drive electrode 33, the upper layer piezoelectric substance 34, and the upper common electrode 36 are formed, in this sequence, through the same procedures. In the process shown in FIG. 8C, the drive electrodes 33 are stacked on the lower piezoelectric substances 35. In the process shown in FIG. 8D, the upper layer piezoelectric substances 34 are formed on the lower layer piezoelectric substances 35 so as to cover the drive electrodes 33. In the process shown in FIG. 8E, the upper common electrode 36 is formed on the surface of the upper piezoelectric substances 34.

In the third process, portions of the conduction electrode are formed simultaneously. Specifically, the same electrode material as that of the drive electrode 33 is continuously applied over the side face (end face) at one side of the lower layer piezoelectric substance 35. As a result, an element end face portion (element section) 39c of the conduction electrode 39 is formed. A portion of the element section 39c comes into contact and conduction with the vibration plate section 39a.

In the element formation process, the range within which the lower common electrode 37, the lower piezoelectric substances 35, the drive electrodes 33, the upper layer piezoelectric substances 34, and the upper common electrode 36 are to be formed is set inward of the chip regions 19 as indicated by reference symbol R shown in FIG. 10.

When the elements have been fabricated up to the upper common electrode 36, processing proceeds to the feed terminal formation process, where the feed terminals 40 are formed. In the feed terminal formation process, the feed terminal 40 is formed in close proximity to the side of the piezoelectric element 17 facing the conduction electrode 39. The feed terminals 40 are formed by application and sintering of a paste. For example, the mask pattern formed in alignment with the feed terminals 40 is placed on the terminal substrate 41 on which the conduction electrodes 39 are formed.

After the mask pattern is placed on the terminal substrate 41, a silver paste is applied over the terminal substrate 41 via the mask pattern. After application of the silver paste, the silver paste is sintered, thereby forming a plurality of feed terminals 40. Similarly, the feed terminals 40 are also formed within the chip regions 19, as in the case of the layers constituting the piezoelectric element 17. Specifically, the feed terminals 40 are formed within the formation range R shown in FIG. 10.

Here, the respective feed terminals 40 are formed at positions spaced from the edge of the chip region 19 by about 10 μm. At these positions, the geometries of the thus-formed feed terminals are substantially identical with those obtained by cutting the feed terminals along the edge of the chip region 19 after portions of the respective feed terminals 40 have been formed outside the chip region 19.

When the feed terminals 40 have been formed, processing proceeds to the cutting process. In the cutting process, the ceramic sheet 18 is cut along cutting lines Y1, Y2 (see FIG. 11) running along the edges of the chip regions 19, thereby producing actuator units 3. In this case, as mentioned above, the formation region R, in which the electrode layers 33, 36, 37, the upper and lower piezoelectric substances, 34, 35, and the conduction electrode 39 and the feed terminal 40 are to be formed, is set inward of the chip region 19. Therefore, electrode material does not adhere to the cutting blade, and hence the cutting blade can be maintained sharp over a long time period. Moreover, the respective actuator units 3 can be cut with superior dimensional accuracy. Since the chips are non-conductive, occurrence of a short-circuit hardly arises even when the chips have adhered to the electrode layer or the like on the vibration plate 14. There can be prevented generation of burrs, which would otherwise be caused by cutting of a metal layer. Hence, ease of assembly of a recording head is achieved in a subsequent process.

After the ceramic sheet is cut into the actuator units 3, an inspection is performed as to whether or not the respective layers constituting the piezoelectric element 17 are formed properly. In the embodiment, the electrostatic capacitance relevant to the dimension (e.g., the thickness or width) of the piezoelectric layer can be measured for each of the piezoelectric substances 34, 35. Since the common electrodes 36, 37 are not electrically connected together, the electrostatic capacitance can be measured for each of the piezoelectric layers 34, 35.

After all the piezoelectric elements 17 have finished undergoing inspection, a determination is made as to whether or not the thus-inspected actuator unit 3 is non-defective. The actuator units 3 that have been determined to be non-defective are classified according to the measured electrostatic capacitance. For instance, the actuator units 3 are ranked according to a mean electrostatic capacitance or on the basis of the range of variation in electrostatic capacitance.

Figure 9:
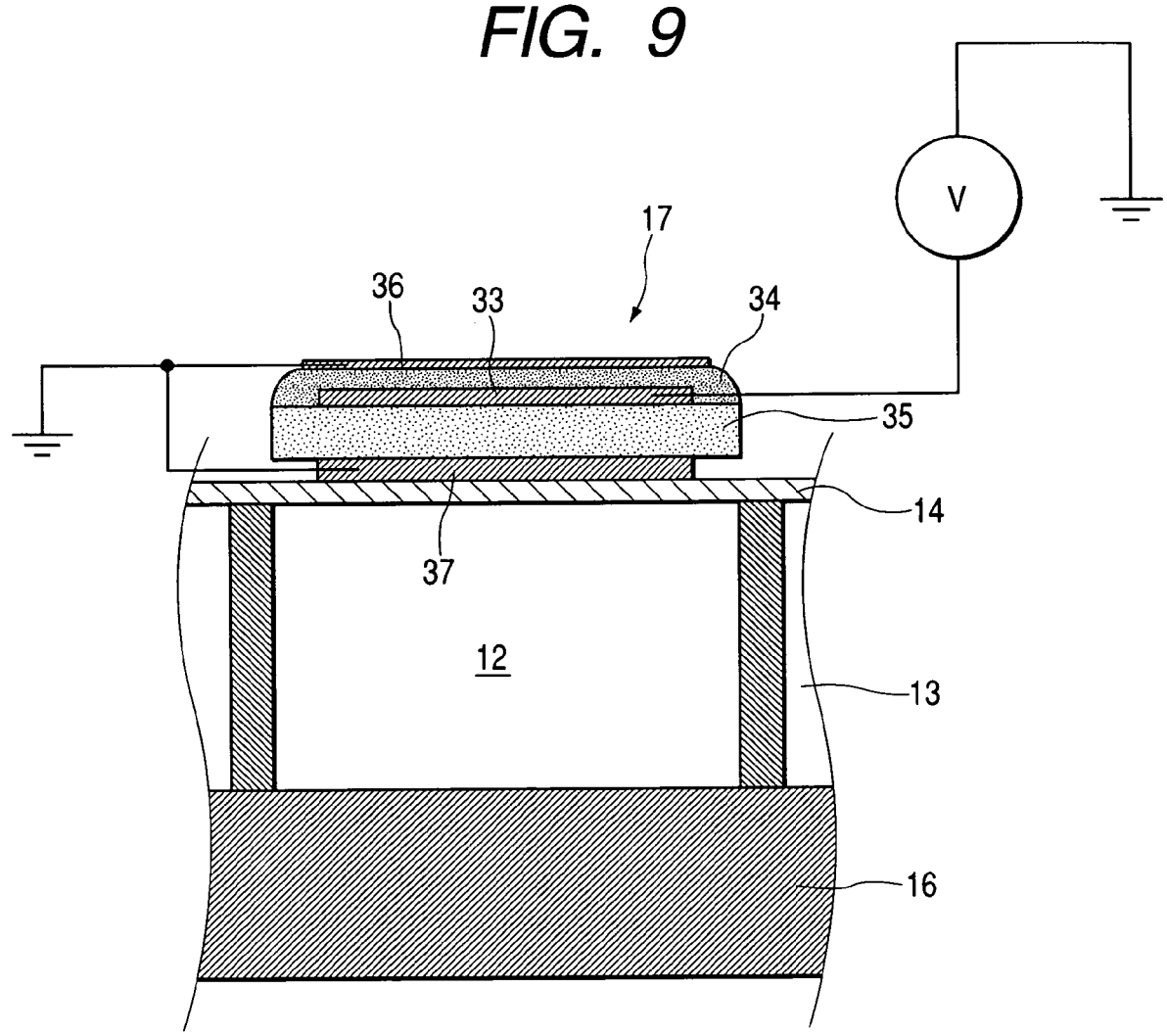
FIG. 9 is a view showing polarization processing of the piezoelectric element.

After having been classified, the actuator units 3 are subjected to a polarization process, where the produced piezoelectric elements 17 are polarized. As shown in, e.g., FIG. 9, in the polarization process the upper common electrode 36 and the lower common electrode 37 are connected to the ground, whereby the drive electrodes 33 are connected to the power source.

In this case, polarization is effected at a voltage which is sufficiently higher than a drive voltage to be used. In the embodiment, the drive voltage is about 30 V, and hence the polarization voltage is set to 70 V or thereabouts. When the polarization voltage is applied to the actuator units over a predetermined time period, the polarization process is completed.

After completion of the polarization process, processing proceeds to a conduction process. As shown in FIG. 8F, in the conduction process, the actuator units 3 that have been subjected to polarization processing are subjected to conduction processing, such as soldering, thereby bringing the upper common electrode 36 into conduction with the lower common electrode 37. For instance, the conduction member 47, such as solder or wire bonding, is provided so as to spread across the conduction area 42a and the conduction strip section 46.

The invention is not limited to the embodiment and is susceptible to various modifications on the basis of the scope of the invention defined by claims.

First, the terminal board 41 of the embodiment may be formed from a conductive material. For instance, the terminal board 41 may be formed from a silver paste which is the same conductive material as that of the supply terminals 40. In this case, the terminal board section 39b of the conduction electrode 39 is also formed on the surface of the vibration plate substrate 14'. Further, the feed terminals 40 are formed from a silver paste so as to be laid over the terminal board 41. By such a configuration, the feed terminals 40 and the terminal board 41 are formed from conductive material, and hence electrical resistance can be diminished.

The invention is described by taking, as an example, a recording head which is a kind of a liquid ejecting head. The invention can also be applied to another liquid ejecting head, such as a liquid-crystal ejecting head or a coloring material ejecting head. Moreover, the invention can also be applied to a piezoelectric actuator used in a micropump or a sounding member.

What is claimed is:

1. A method of manufacturing a piezoelectric actuator, comprising:

preparing a substrate, which is adapted to be a vibration plate actuated by a piezoelectric element;

defining cutting lines corresponding to a plurality of chip regions on the substrate, each of the chip regions being adapted to be the piezoelectric actuator;

forming a first common electrode of the piezoelectric element on the substrate, so as to avoid the cutting lines;

forming a first piezoelectric layer of the piezoelectric element on the first common electrode;

forming a drive electrode of the piezoelectric element on the first piezoelectric layer, so as to avoid the cutting lines;

forming a second piezoelectric layer of the piezoelectric element on the drive electrode;

forming a second common electrode of the piezoelectric element on the second piezoelectric layer, so as to avoid the cutting lines; and cutting completely the substrate along the cutting lines with a cutting blade so as to avoid the first common electrode, the second common electrode and the drive electrode, thereby separating each of the chip regions from each other.

2. The manufacturing method as set forth in claim 1, further comprising forming a terminal electrically connected to the drive electrode, so as not to extend beyond the outline of each of the chip regions, the terminal forming being performed after the second common electrode is formed and before the substrate is cut.

3. A manufacturing method of a liquid ejecting head, comprising joining the piezoelectric actuator manufactured by the method as set forth in claim 1 with another substrate in which a pressure chamber communicated with a nozzle orifice is formed, such that the piezoelectric element opposes the pressure chamber.

* * * * *